(12) United States Patent
Shin et al.

(10) Patent No.: US 11,655,533 B2
(45) Date of Patent: May 23, 2023

(54) EXTERIOR MATERIAL OF HOME APPLIANCE, HOME APPLIANCE INCLUDING EXTERIOR MATERIAL AND MANUFACTURING METHOD OF EXTERIOR MATERIAL OF HOME APPLIANCE

(71) Applicant: Samsung Electronics Co., Ltd, Suwon-si (KR)

(72) Inventors: Hyun Seok Shin, Suwon-si (KR); Kwang Joo Kim, Seoul (KR); Young Deog Koh, Seongnam-si (KR); Jin O Kwak, Suwon-si (KR); Da Hyun Byeoun, Suwon-si (KR); Young Min Yoo, Suwon-si (KR); Kyung Hwan Lee, Suwon-si (KR); Min Kyung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 436 days.

(21) Appl. No.: 16/609,178

(22) PCT Filed: Apr. 19, 2018

(86) PCT No.: PCT/KR2018/004529
§ 371 (c)(1),
(2) Date: Oct. 28, 2019

(87) PCT Pub. No.: WO2018/199548
PCT Pub. Date: Nov. 1, 2018

(65) Prior Publication Data
US 2020/0224303 A1    Jul. 16, 2020

(30) Foreign Application Priority Data

Apr. 28, 2017    (KR) .......................... 10-2017-0055711

(51) Int. Cl.
*C23C 14/06* (2006.01)
*B05D 5/08* (2006.01)
(Continued)

(52) U.S. Cl.
CPC ............ *C23C 14/0605* (2013.01); *B05D 5/08* (2013.01); *C23C 14/021* (2013.01);
(Continued)

(58) Field of Classification Search
CPC . C23C 14/021; C23C 14/025; C23C 14/0611; F24C 15/00
(Continued)

(56) References Cited

U.S. PATENT DOCUMENTS

2013/0140776 A1\*  6/2013  Kennedy ............... F16J 9/26
                                              427/299
2015/0079398 A1\*  3/2015  Amin ................... C03C 17/225
                                              423/325
2017/0187856 A1\*  6/2017  Kim ...................... H04B 1/3888

FOREIGN PATENT DOCUMENTS

CN          101634029 A      1/2010
CN          104674247 A      6/2015
(Continued)

OTHER PUBLICATIONS

KR-20160028174-A Translation (Year: 2016).\*
(Continued)

*Primary Examiner* — Seth Dumbris

(57) ABSTRACT

An exterior material of a home appliance having improved corrosion resistance and fingerprint resistance by changing a treatment method of a surface of the exterior material, and the home appliance including the same, and a manufacturing method therefor are provided. The method of manufacturing the exterior material of the home appliance, the method including applying a diamond like carbon (DLC) coating on
(Continued)

the substrate to form a DLC coating layer; and conducting anti-fingerprint coating to form the anti-fingerprint coating on the DLC coating layer.

4 Claims, 15 Drawing Sheets

(51) Int. Cl.
    *C23C 14/02*     (2006.01)
    *C23C 14/22*     (2006.01)
    *C25D 11/38*     (2006.01)
    *C25F 1/04*     (2006.01)
    *F24C 15/00*     (2006.01)

(52) U.S. Cl.
    CPC ........ *C23C 14/025* (2013.01); *C23C 14/0611* (2013.01); *C23C 14/221* (2013.01); *C25D 11/38* (2013.01); *C25F 1/04* (2013.01); *F24C 15/00* (2013.01); *Y10T 428/30* (2015.01)

(58) Field of Classification Search
    USPC ........................................................ 428/408
    See application file for complete search history.

(56) References Cited

FOREIGN PATENT DOCUMENTS

| | | | | |
|---|---|---|---|---|
| CN | 105152548 A | 12/2015 | | |
| JP | 2011-167891 A | 9/2011 | | |
| KR | 10-2010-0003614 A | 1/2010 | | |
| KR | 10-2010-0067856 A | 6/2010 | | |
| KR | 10-2011-0087911 A | 8/2011 | | |
| KR | 10-2015-0074768 A | 7/2015 | | |
| KR | 10-2016-0028174 A | 3/2016 | | |
| KR | 20160028174 A | * | 3/2016 | ............... H04B 1/38 |

OTHER PUBLICATIONS

Office Action dated Jan. 21, 2021 in connection with Chinese Patent Application No. 201880028121.3, 21 pages.
International Search Report dated Aug. 10, 2018 in connection with International Patent Application No. Pct/KR2018/004529, 2 pages.
Written Opinion of the International Searching Authority dated Aug. 10, 2018 in connection with International Patent Application No. Pct/KR2018/004529, 8 pages.
The Second Office Action dated Aug. 11, 2021 in connection with Chinese Application No. 201880028121.3, 24 pages.
Notice of Preliminary Rejection dated Jul. 20, 2021 in connection with Korean Application No. 10-2017-0055711, 13 pages.
Korean Intellectual Property Office, "Notice of Preliminary Rejection," dated Mar. 15, 2022, in connection with Korean Patent Application No. 10-2017-0055711, 5 pages.
China National Intellectual Property Administration, "Decision of Rejection," dated Apr. 27, 2022, in connection with Chinese Patent Application No. 201880028121.3, 18 pages.
The Third Office Action dated Jan. 17, 2022, in connection with Chinese Application No. 201880028121.3, 17 pages.
Notice of Preliminary Rejection dated Jan. 19, 2022, in connection with Korean Application No. 10-2017-0055711, 5 pages.

* cited by examiner

EXTERIOR MATERIAL OF HOME APPLIANCE, HOME APPLIANCE INCLUDING EXTERIOR MATERIAL AND MANUFACTURING METHOD OF EXTERIOR MATERIAL OF HOME APPLIANCE

CROSS-REFERENCE TO RELATED APPLICATIONS

This application is a 371 of International Application No. PCT/KR2018/004529 filed on Apr. 19, 2018, which claims priority to Korean Patent Application No. 10-2017-0055711 filed on Apr. 28, 2017, the disclosures of which are herein incorporated by reference in their entirety.

BACKGROUND

1. Field

The disclosure relates to an exterior material of a home appliance, a home appliance including the same, and a method for manufacturing the same, and more specifically to, an exterior material of a home appliance having improved corrosion resistance and fingerprint resistance by changing a treatment method of a surface of an exterior material, a home appliance including the same, and a manufacturing method thereof.

2. Description of Related Art

Recently, stainless steel is used as an exterior material of home appliances, and when a diamond like carbon (DLC) coating is applied to stainless steel, damage may occur in the manufacturing process, such as pressing, bending, cutting, and the like. In addition, when a high concentration of chlorine ions are introduced in such a damaged state, dissolution starts partially, and the chlorine complex ions accumulated in a generated cavity causes hydrolysis to lower the PH in the cavity and activate corrosion. In addition, when the DLC coating is applied to the exterior material of the home appliance, it is difficult to remove contaminants such as fingerprints, oil, and dirt, and thus a surface of the exterior material of the home appliance may become easily dirty.

SUMMARY

One aspect of the disclosure relates to an exterior material of a home appliance having improved corrosion resistance and fingerprint resistance, a home appliance including the same, and a manufacturing method thereof.

In accordance with an aspect of the disclosure, a method of manufacturing an exterior material of a home appliance is provided. The method includes applying a DLC (Diamond like carbon) coating on a substrate to form a DLC coating layer and conducting an anti-fingerprint coating to form an anti-fingerprint coating layer on the DLC coating layer.

The method may further include passivating the substrate.

The DLC coating layer may be formed after forming a chromium (Cr) buffer coating layer on the substrate.

The passivating of the substrate may include electrolytic pickling that proceeds with surface cleaning with a phosphate pickling solution.

The passivating of the substrate may include an electrolytic passivation treatment using a solution containing a dichromate acid passivating solution and an amine additive.

The method may further include a degreasing and washing step before the electrolytic pickling.

The method may further include a washing step before and after the electrolytic passivation treatment.

The passivating of the substrate may include a drying step to remove moisture.

The method may further include performing etching on a surface of the substrate prior to the formation of the DLC coating layer.

The method may further include injecting an ion beam on the substrate to increase the adhesion of the substrate prior to the formation of the chromium buffer coating layer.

In accordance with another aspect of the disclosure, an exterior material of a home appliance is provided. The exterior material of home appliance includes a substrate; a DLC(Diamond like carbon) coating layer formed on the substrate; a buffer coating layer formed between the substrate and the DLC coating layer to improve adhesion between the substrate and the DLC coating layer; and an anti-fingerprint coating layer formed on an upper surface of the DLC coating layer.

The buffer coating layer may be provided with a chrome buffer coating layer.

The substrate may be provided with a passivation treatment.

The passivation treatment of the substrate may include electrolytic pickling using a phosphate pickling solution, and an electrolytic passivation treatment using a solution containing a dichromate acid passivating solution and an amine additive.

An etching portion from which an oxide film is removed may be formed on an upper surface of the substrate to increase adhesion to the DLC coating layer.

The buffer coating layer may have a thickness of 0.1 μm to 1.0 μm.

The DLC coating layer may have a thickness of 2 μm to 4 μm.

The anti-fingerprint coating layer may have a thickness of 0.05 μm to 0.15 μm.

In accordance with another aspect of the disclosure, a home appliance is provided. The home appliance includes, a main body; a heating unit fueled for cooking food, located in an upper portion of the main body; and an exterior material provided on an upper surface of the main body, wherein the exterior material of the home appliance comprising: a substrate; a DLC(Diamond like carbon) coating layer formed on the substrate; a buffer coating layer formed between the substrate and the DLC coating layer to improve adhesion between the substrate and the DLC coating layer; and an anti-fingerprint coating layer formed on an upper surface of the DLC coating layer.

The substrate of the exterior material may be provided with a passivation treatment to prevent corrosion by pin holes formed when the DLC coating layer is coated.

As is apparent from the above, it is possible to prevent the exterior material of the home appliance from being corroded and to easily remove contaminants on the surface of the exterior material of the home appliance.

DETAILED DESCRIPTION

The following description with reference to the accompanying drawings is provided to assist in the comprehensive understanding of various embodiments of the disclosure as defined by the claims and their equivalents. An example of a home appliance of the disclosure will be described as an example of a cooking appliance, but is not limited thereto. Embodiments of the disclosure may be applied to an exterior material of the home appliance in which stainless steel is used, and the home appliance including the same.

Figure 1:
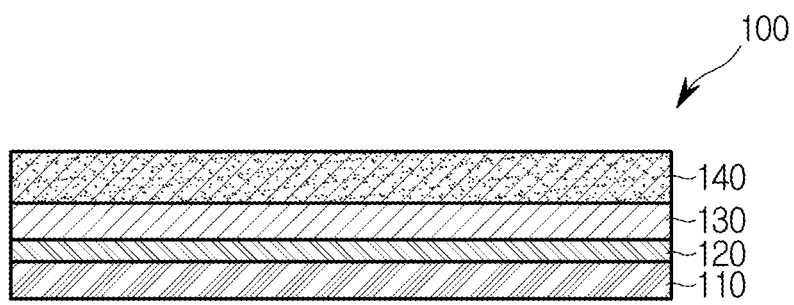
FIG. 1 is a view showing lamination of coating layers of an exterior material of a home appliance according to an embodiment of the disclosure.
Figure 2:
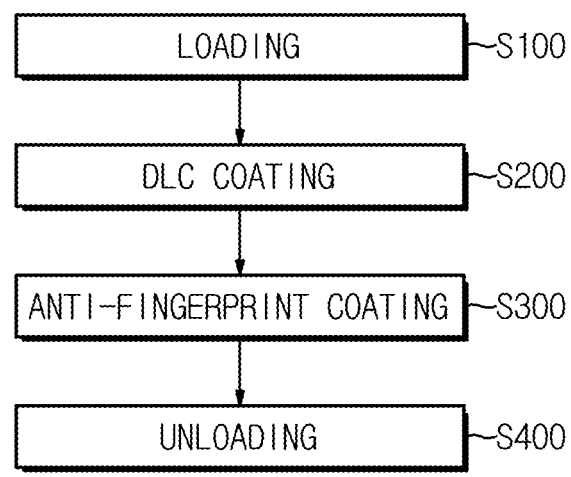
FIG. 2 is a flowchart illustrating a method of manufacturing an exterior material of a home appliance according to an embodiment of the disclosure.

FIG. 1 is a view showing lamination of a coating layer of an exterior material of a home appliance according to an embodiment of the disclosure, and FIG. 2 is a flowchart illustrating a method of manufacturing an exterior material of a home appliance according to an embodiment of the disclosure.

As shown in FIG. 1, an exterior material 100 of a home appliance according to an embodiment of the disclosure includes a substrate 110 and a DLC (Diamond like carbon) coating layer 130 formed on the substrate 110. An anti-fingerprint coating layer 140 is formed on an upper surface of the DLC coating layer 130.

Coating of the exterior material 100 of the home appliance is a step of loading the substrate 110 (S100); forming the DLC coating layer 130 on the upper portion of the exterior material 100 of the home appliance (S200); forming the anti-fingerprint coating layer 140 on an upper portion of the DLC coating layer 130 (S300); and unloading the substrate 110 (S400).

A buffer coating layer 120 may be provided between a top surface of the substrate 110 and the DLC coating layer 130. This will be described later.

Figure 3:
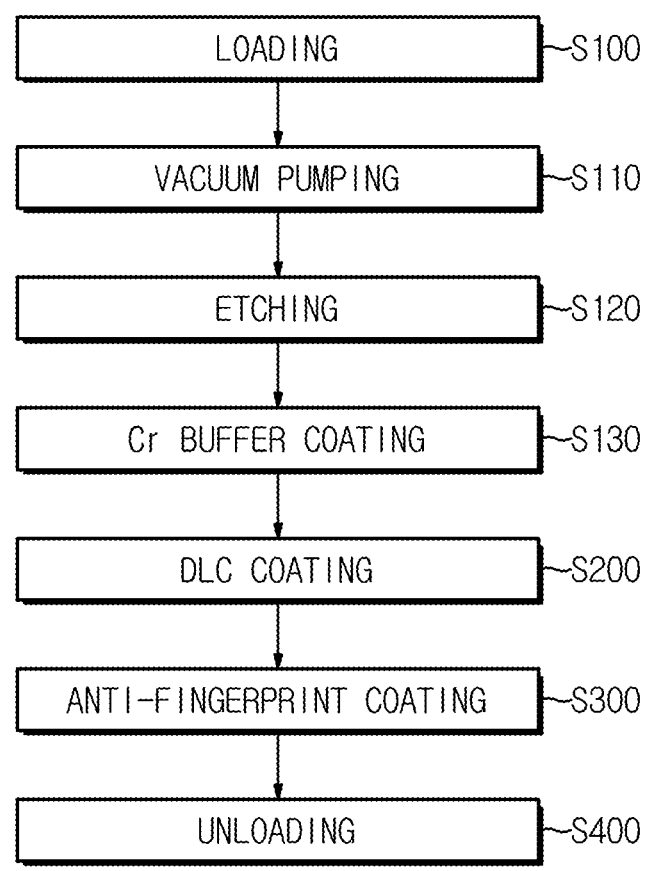
FIG. 3 is a flowchart illustrating a DLC coating process of a manufacturing method of an exterior material of a home appliance according to an embodiment of the disclosure.
Figure 4:
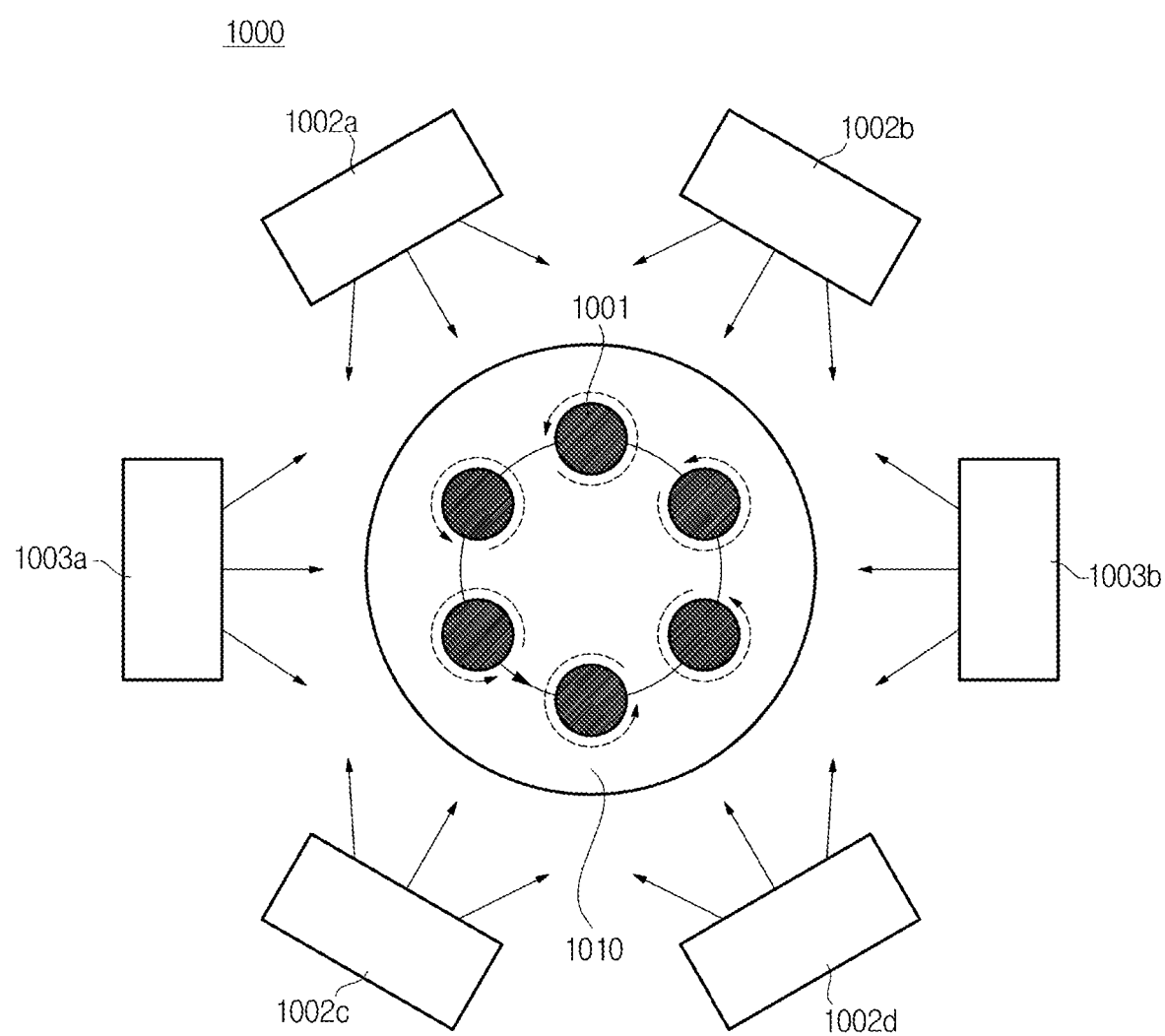
FIG. 4 is a view schematically showing a process for forming a coating layer on an exterior material of a home appliance according to an embodiment of the disclosure.

FIG. 3 is a flowchart illustrating a DLC coating process of a manufacturing method of an exterior material of a home appliance according to an embodiment of the disclosure, and FIG. 4 is a view schematically showing a process for forming a coating layer on an exterior material of a home appliance according to an embodiment of the disclosure.

The flowchart illustrated in FIG. 3 specifically describes a coating process in a method of manufacturing the exterior material of the home appliance according to an embodiment of the disclosure from the flowchart illustrated in FIG. 2.

DLC coating and anti-fingerprint coating of the coating process of the disclosure is sequentially performed in one process described in FIG. 4 below. The coating process of the disclosure proceeds as follows.

A coating system undergoing the coating process includes ion guns 1002a, 1002b, 1002c, and 1002d and deposition apparatuses 1003a and 1003b in a vacuum chamber 1000. The four ion guns 1002a, 1002b, 1002c, and 1002d may be provided and may be arranged in a quadrangular shape. The deposition apparatus 1003a may be provided between the ion gun 1002a and the ion gun 1002c. In addition, the other deposition apparatus 1003b may be provided between the other ion gun 1002b and the ion gun 1002d. In the case of the coating system in which the coating process of the disclosure is performed, the two deposition apparatuses 1003a and 1003b may be included. In the center of the coating system, a substrate 1001 is positioned on a base material 1010, and the substrate 1001 rotates to perform the coating.

The substrate 1001 is loaded onto the base material 1010 (S100).

Pumping is performed in a vacuum (S110). According to one embodiment of the disclosure, vacuum pumping is performed for about 180 minutes, and the air pressure in the vacuum chamber 1000 is maintained at 7.0*105 torr or less.

The surface of the substrate 1001 is etched (S120). Etching is intended to clean up and activate the substrate 1001 surface prior to coating layer formation. According to an embodiment of the disclosure, an etching portion may be formed between the substrate 110 and the buffer coating layer 120.

A linear ion source (LIS) step of injecting an ion beam onto the substrate 1001 is performed (S121). The LIS step is performed for about 120 minutes. The LIS step injects argon (Ar) at 10 to 50 sccm (standard cubic centimeters per minute: cm 3/min) in the chamber and applies power to the base material 1010 at 1500±500V. The LIS step is to improve the adhesion of the coating layer to the substrate 1001.

Buffer coating is performed on the substrate 1001 (S130). The buffer coating (S130) proceeds with a chromium (Cr) coating. The buffer coating proceeds for about 360 minutes, argon (Ar) is injected at 10-50 sccm and power is applied to the base material at 5±1 kW. The buffer coating is to improve the adhesion between the substrates 1001 and 110 and the DLC coating 130 layer. The buffer coating is carried out through vacuum deposition, in which chromium is heated to evaporate and chromium vapor is adhered to a thin film by steam.

DLC coating is performed on the buffer coating layer 120 (S200). The DLC coating according to an embodiment of the disclosure may use ion deposition. Ion deposition is a method of ionizing hydrocarbon-based gas by plasma discharge and accelerating collision with a base material to form a film. Acetylene ($C_2H_2$), methane ($CH_4$), and benzene ($C_6H_6$) may be used as the hydrocarbon gas. The DLC coating according to an embodiment of the disclosure proceeds for about 420 minutes, injecting acetylene ($C_2H_2$) at 10 to 50 sccm and power is applied to the base material at 1500±500V. The DLC coating may be performed by adjusting the power applied to the ion guns 1002a, 1002b, 1002c, and 1002d and the base material 1010.

The anti-fingerprint coating (AF coating) on the DLC coating layer 130 is performed (S300). The anti-fingerprint coating proceeds for about 30 minutes.

According to an embodiment of the disclosure, the anti-fingerprint coating may be performed using a thermal evaporation method and a spray method.

The thermal evaporation method is a method in which the anti-fingerprint coating is carried out dry. In the thermal evaporation method, the substrate 1001 is washed with isopropyl alcohol (IPA), and heat is applied in the vacuum chamber 1000 to evaporate the coating solution.

The spray method is a method in which the anti-fingerprint coating is carried out wet. In the thermal evaporation method, the substrate is washed with isopropyl alcohol, a coating liquid is sprayed using a spray gun, and the coating is performed and dried. Drying can be carried out at 150° C. for 5 minutes.

The anti-fingerprint coating is to prevent fingerprints on the exterior material 100 of the home appliance, thus it is possible to easily remove contaminants.

Referring to FIG. 1, the thickness of the buffer coating layer 120 may be 0.1 μm to 1.0 μm. In addition, the thickness of the DLC coating layer 130 may be 2 μm to 4 μm. In addition, the anti-fingerprint coating layer 140 may have a thickness of 0.05 μm to 0.15 μm.

Figure 5:
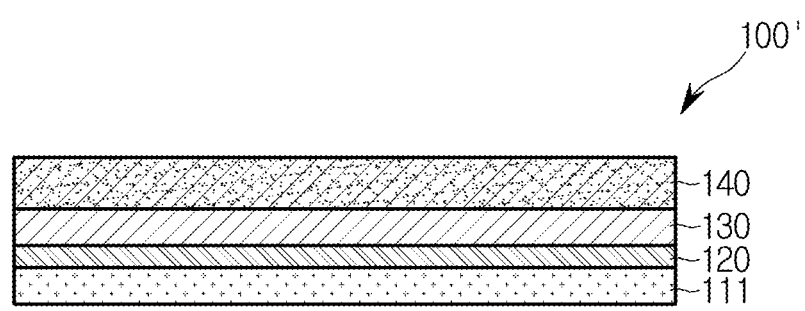
FIG. 5 is a view showing lamination of a coating layer of an exterior material of a home appliance according to another embodiment of the disclosure.
Figure 6:
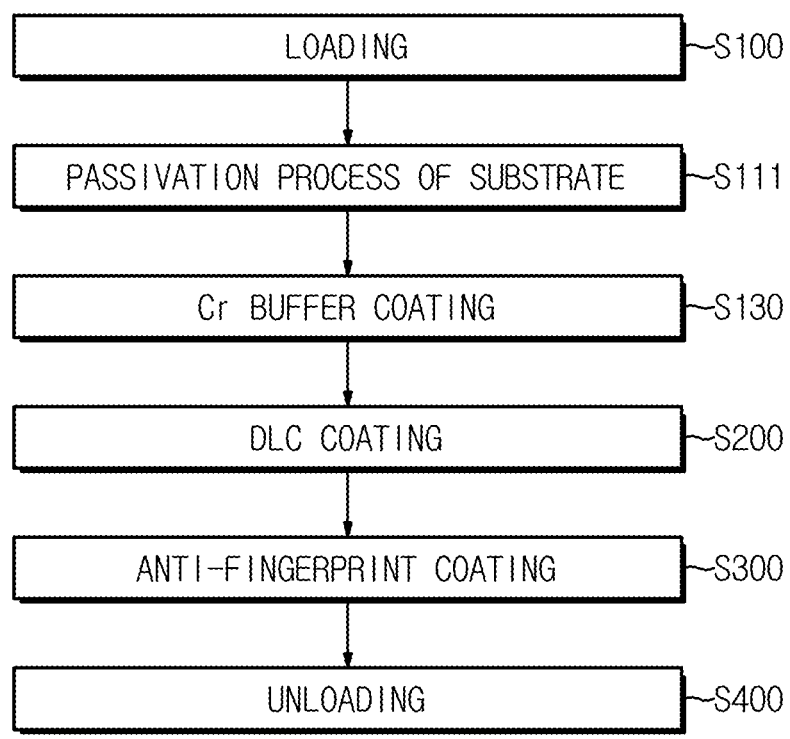
FIG. 6 is a flowchart illustrating a method of manufacturing an exterior material of a home appliance according to another embodiment of the disclosure.
Figure 7:
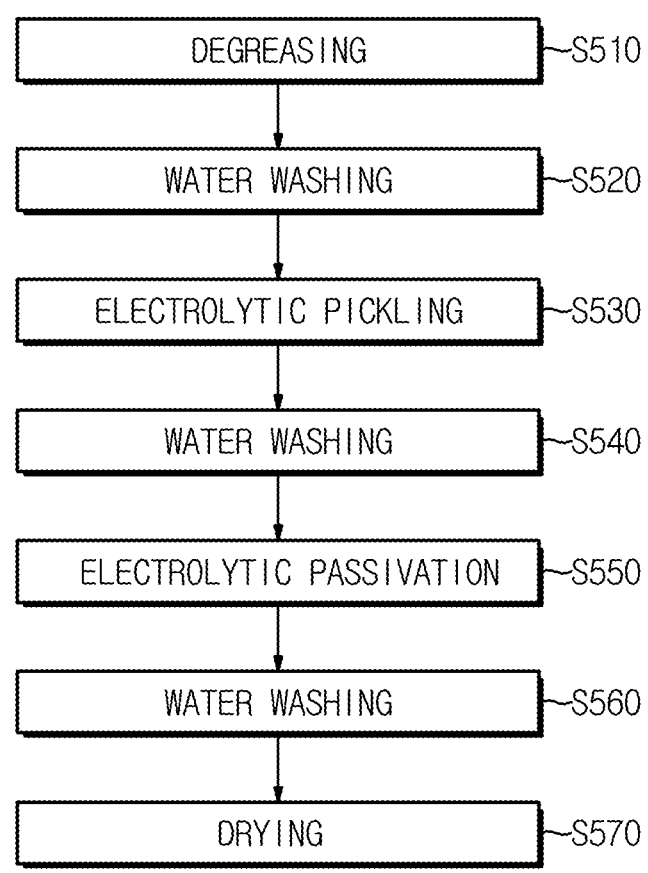
FIG. 7 is a flowchart illustrating a passivation process applied to an exterior material of a home appliance according to another embodiment of the disclosure.

FIG. 5 is a view showing lamination of a coating layer of an exterior material of a home appliance according to another embodiment of the disclosure, FIG. 6 is a flowchart illustrating a method of manufacturing an exterior material of a home appliance according to another embodiment of the disclosure, and FIG. 7 is a flowchart illustrating a passivation process applied to an exterior material of a home appliance according to another embodiment of the disclosure.

Referring to FIG. 5, the substrate 111 may be passivated. In addition to the passivated substrate 111, the buffer coating layer 120, the DLC coating layer 130, and the anti-fingerprint coating layer 140 are the same as those of the embodiment shown in FIG. 1, and thus descriptions thereof will be omitted.

Thus, according to an embodiment of the disclosure, the passivation process is performed on the substrate 111 (S111), and passes through the coating process (S130, S200, S300). The coating process (S130, S200, S300) may include a chromium buffer coating (S130), the DLC coating (S200), and the anti-fingerprint coating (S300) as described above.

The passivation process of the disclosure proceeds as follows.

Degreasing to wash the substrate using a solvent of oil is carried out (S510). The solvent of the oil may be, for example, an alkaline solution. Sodium hydroxide, sodium carbonate, sodium silicate, sodium phosphate, sodium cyanide and the like may be used as the alkaline solution. According to an embodiment of the disclosure, the alkaline solution used was KPM TECH C-4000.

The degreasing temperature may be 45±5° C. and the deposition time may be 5 to 10 minutes.

After degreasing (S510), water washing for cleaning degreasing liquid is performed (S520). Industrial water may be used as the washing water.

After water washing, sponge washing may be further performed (S521).

Electrolytic pickling is in progress (S530). The electrolytic pickling may be performed using a phosphate pickling solution. Sodium metaphosphate ($NaPO_3$) may be used as the phosphate pickling solution. The electrolytic pickling may proceed for at least 2 minutes at a voltage of 1-6V and a temperature of 40-70° C.

After the electrolytic pickling (S530), water washing for cleaning pickling liquid is performed (S540). Industrial water may be used as the washing water.

Degreasing may be further performed after washing (S540) (S541). According to an embodiment of the disclosure, degreasing may be performed by electrolytic degreasing.

According to one embodiment of the disclosure, the degreasing solution used was KPM TECH C-4000.

The electrolytic degreasing may proceed for 30±10 seconds at a voltage of 6.5±1.5V and a temperature of 45±5° C.

Thereafter, pickling and washing may be further performed (S542).

A 5% solution of sulfuric acid ($H_2SO_4$) may be used as the pickling solution, and the sulfuric acid purity may be 98%. In addition, the pickling time may be 5 seconds.

Electrolytic passivation proceeds (S550). The electrolytic passivation may be performed using a solution containing a dichromate acid passivating solution and an amine additive. According to one embodiment of the disclosure, as the electrolytic passivation solution, EP-POST3 of KPM TECH may be used, and the concentration of the solution may be maintained at 10 to 20%. The electrolytic passivation may proceed for 90±10 seconds at a voltage of 3 to 5V, a pH of 4 to and a temperature of 25 to 50° C. If the pH of the solution is low, sodium hydroxide (NaOH) can be added. If the pH is high, EL-POST 3 can be added.

Water washing for washing passivating fluid is performed (S560). Industrial water may be used as the washing water.

In addition, neutralization may be performed (S561).

5% sulfuric acid ($H_2SO_4$) may be used as a neutralization solution, and the sulfuric acid purity may be 98%. The neutralization time may be at least 5 seconds.

Thereafter, further washing may proceed (S562). Industrial water may be used as the washing water.

Thereafter, boiling water washing may be further performed (S563). Industrial water may be used as the washing water, the temperature may be 70±10° C., and the deposition time may be more than 5 seconds.

Afterwards, further washing may proceed (S564). Washing water may be used as the industrial water.

Thereafter, washing with distilled water may be further performed (S565).

Drying is in progress (S570). According to an embodiment of the disclosure, hot air drying may be performed. The temperature of the hot air drying may be above 65° C., and the time of the hot air drying may be 10 to 30 minutes.

Figure 8:
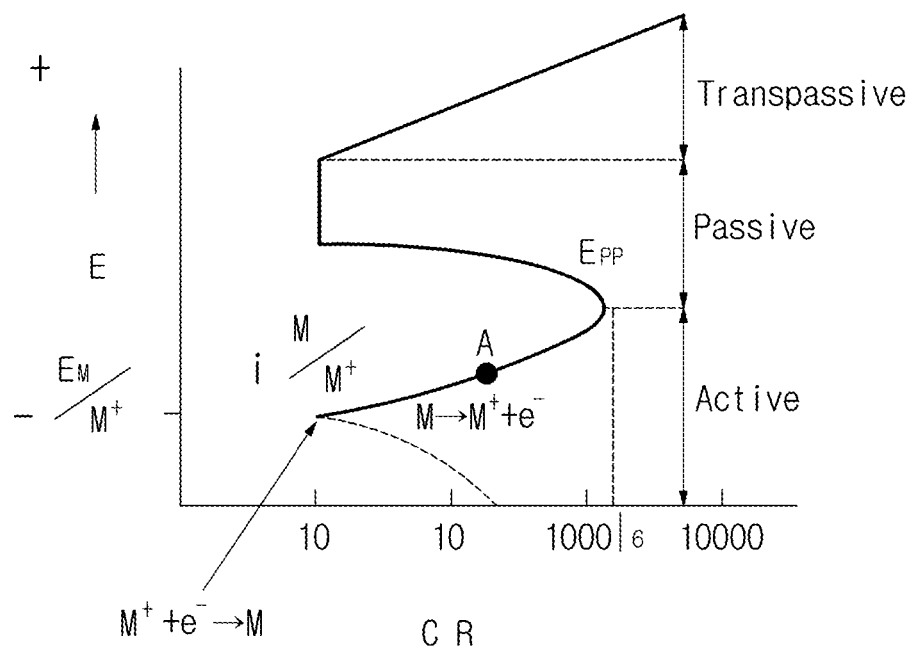
FIG. 8 shows polarization curves of metals and alloys.

FIG. 8 shows polarization curves of metals and alloys.

Referring to FIG. 8, in a transpassive range, the film is thick during passivation, but there is a problem in appearance. In the passivation within an active range, reliable substrates cannot be obtained. According to one embodiment of the present disclosure, it is possible to manufacture a product that is reliable and satisfies appearance characteristics in the case of passivation treatment in a passive range.

Hereinafter, an experimental result of experiments on corrosion resistance, surface strength, and easy removal of contaminants of an exterior material of a home appliance in which a passivation process and a coating process are performed according to an embodiment of the disclosure will be described.

The exterior material of the home appliance according to the embodiment of the disclosure used in the following experiment was subjected to the passivation process and the coating process.

Figure 9A:
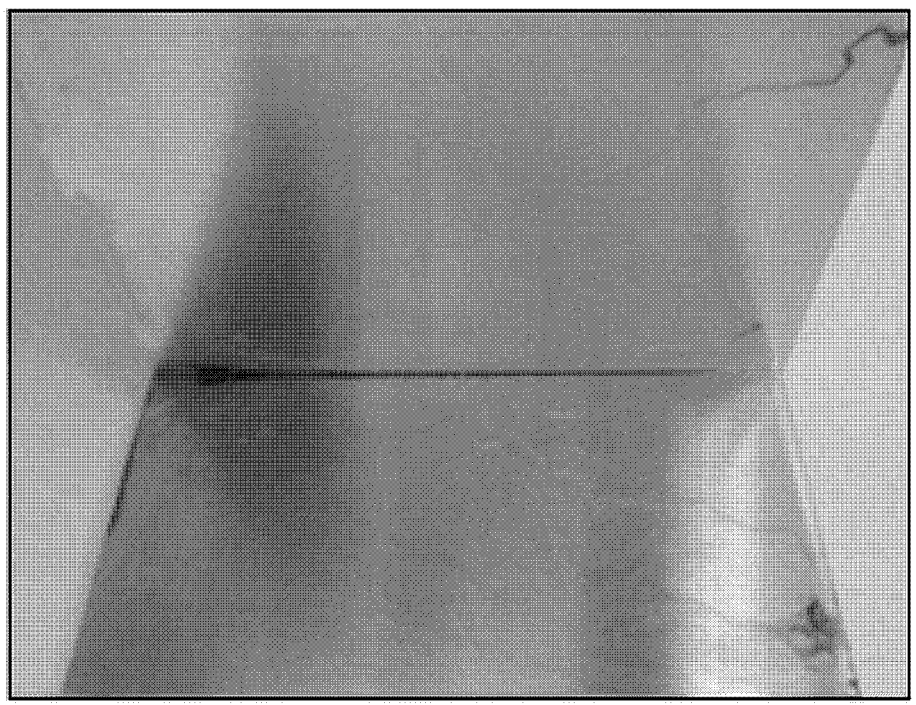
FIG. 9a is a photograph of a salt spray experiment performed on an exterior material of a home appliance to which a passivation treatment is not applied.
Figure 9B:
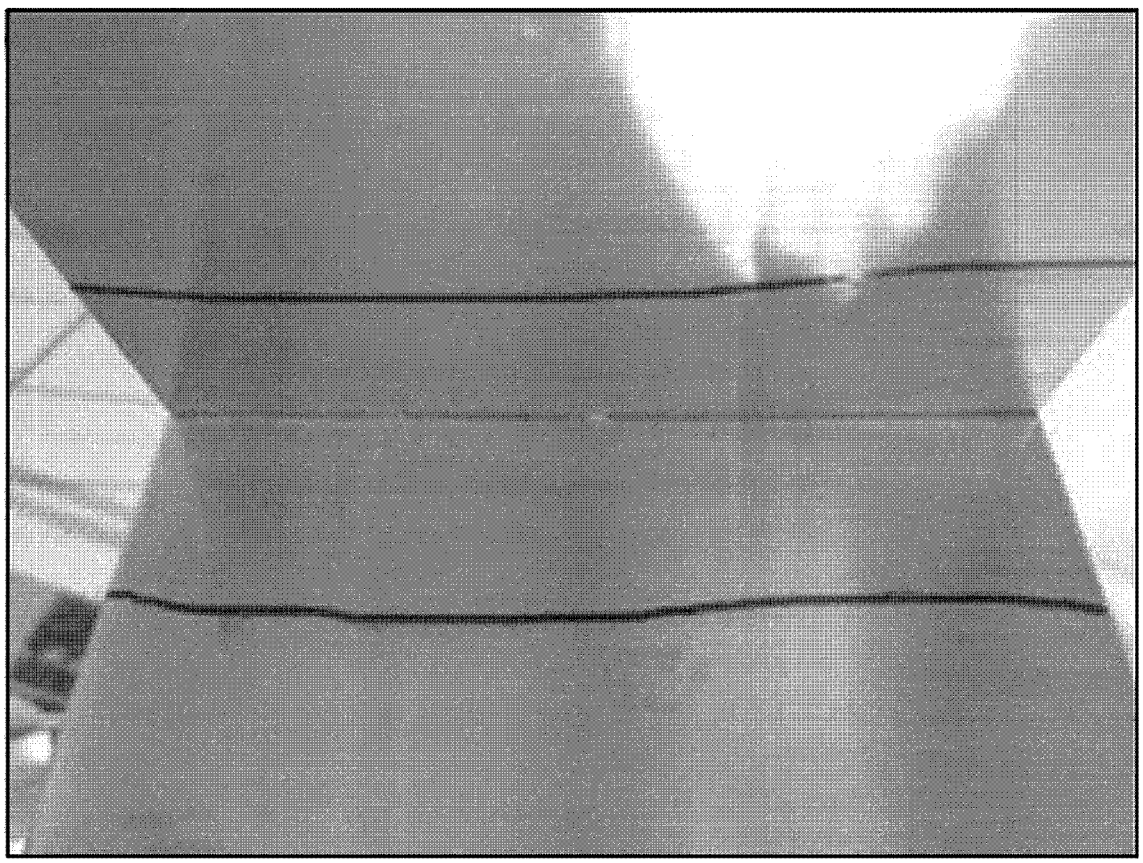
FIG. 9b is a photograph of a salt spray experiment performed on an exterior material of a home appliance to which a passivation treatment is applied according to another embodiment of the disclosure.

FIG. 9*a* is a photograph of a salt spray experiment performed on an exterior material of a home appliance to which a passivation treatment is not applied, and FIG. 9*b* is a photograph of a salt spray experiment performed on an exterior material of a home appliance to which a passivation treatment is applied according to another embodiment of the disclosure.

10 cycles of salt spray were performed. At this time, a 5% solution of sodium chloride (NaCl) was sprayed for 8 hours, and 16 hours of rest was defined as 1 cycle.

Referring to FIG. 9*a*, it can be seen that rust has occurred in the exterior of the home appliance in two cycles. In the case of FIG. 9*b*, which is the exterior material of the home appliance to which the passivation treatment is applied according to an embodiment of the disclosure, no rust occurs even after 10 cycles of salt spraying, and it can be confirmed that there is no abnormality in appearance.

Accordingly, it can be seen that the passivation treatment according to an embodiment of the disclosure can improve the corrosion resistance of the exterior material of the home appliance. In addition, the passivation treatment according to an embodiment of the disclosure may prevent corrosion due to pin holes that may occur during the DLC coating.

Figure 10:
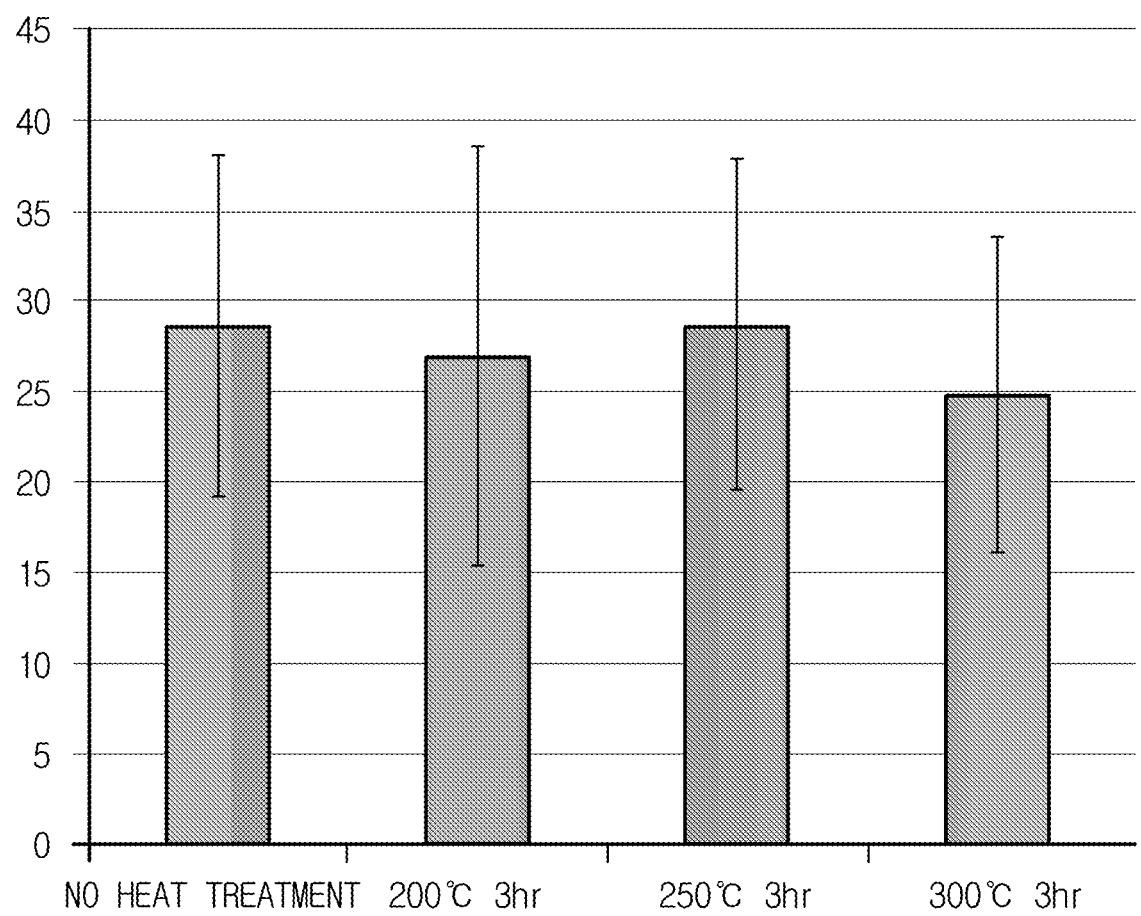
FIG. 10 is a graph showing a surface hardness when an exterior material of a home appliance to which a coating process is applied according to another embodiment of the disclosure is heated.

FIG. 10 is a graph showing a surface hardness when an exterior material of a home appliance to which a coating process is applied according to another embodiment of the disclosure is heated.

As shown in FIG. 10, the exterior material of the home appliance to which the coating process is applied according to an embodiment of the disclosure has no color change even when left at 300° C. for 3 hours, and the surface hardness of about 25 Gpa is maintained.

Figure 11:
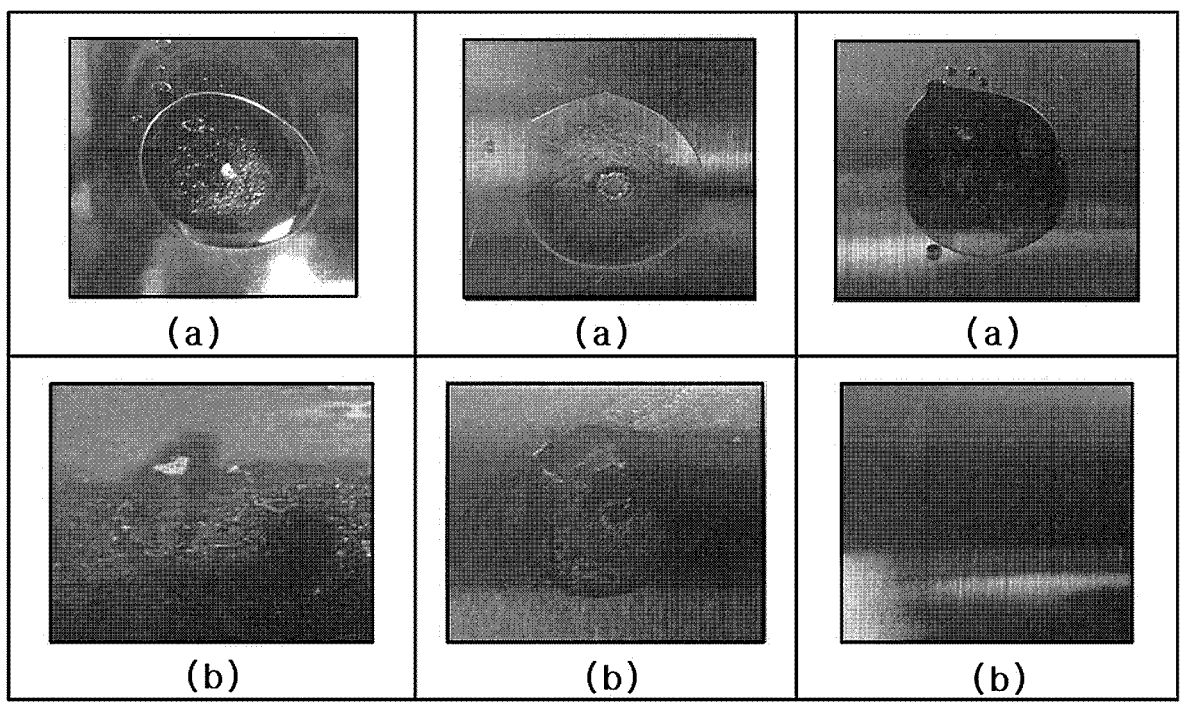
FIG. 11 is a photograph illustrating experiments on removal of contaminants with respect to juice dropped on enamel, an exterior material of a home appliance not applied to a coating process of the disclosure, and an exterior material of a home appliance to which a coating process is applied according to the embodiment of the disclosure.
Figure 12:
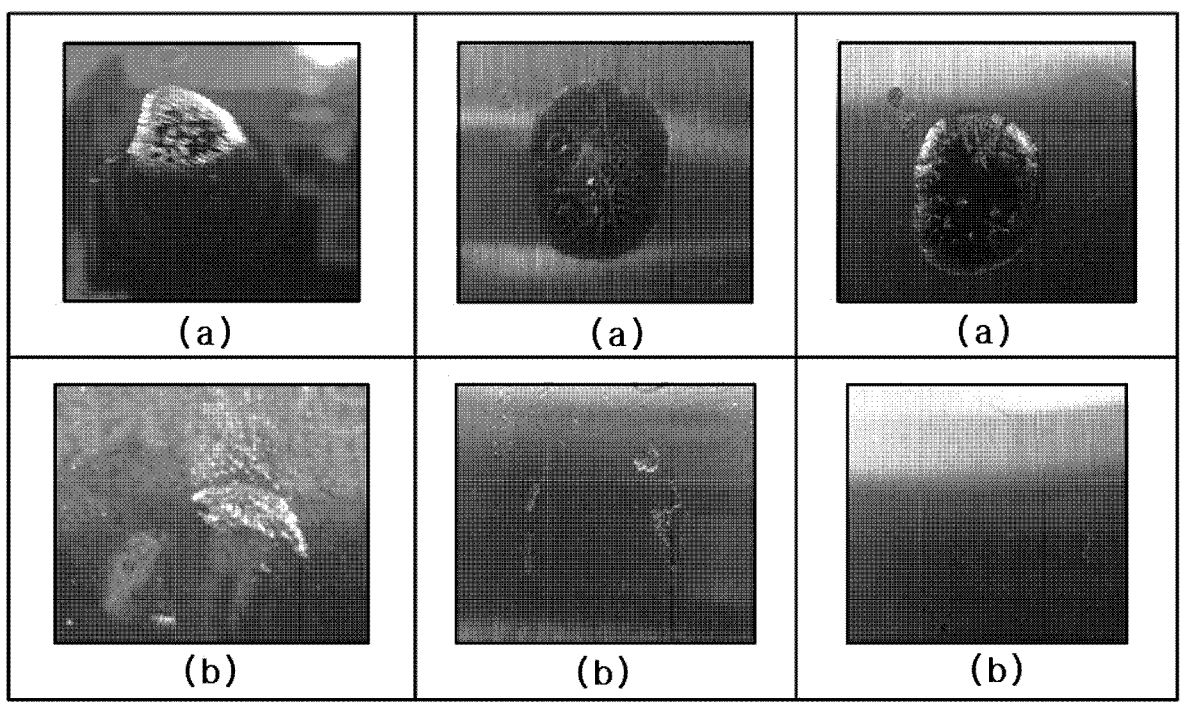
FIG. 12 is a photograph illustrating experiments on removal of contaminants with respect to soy sauce dropped on enamel, an exterior material of a home appliance not applied to a coating process of the disclosure, and an exterior material of a home appliance to which a coating process is applied according to the embodiment of the disclosure.
Figure 13:
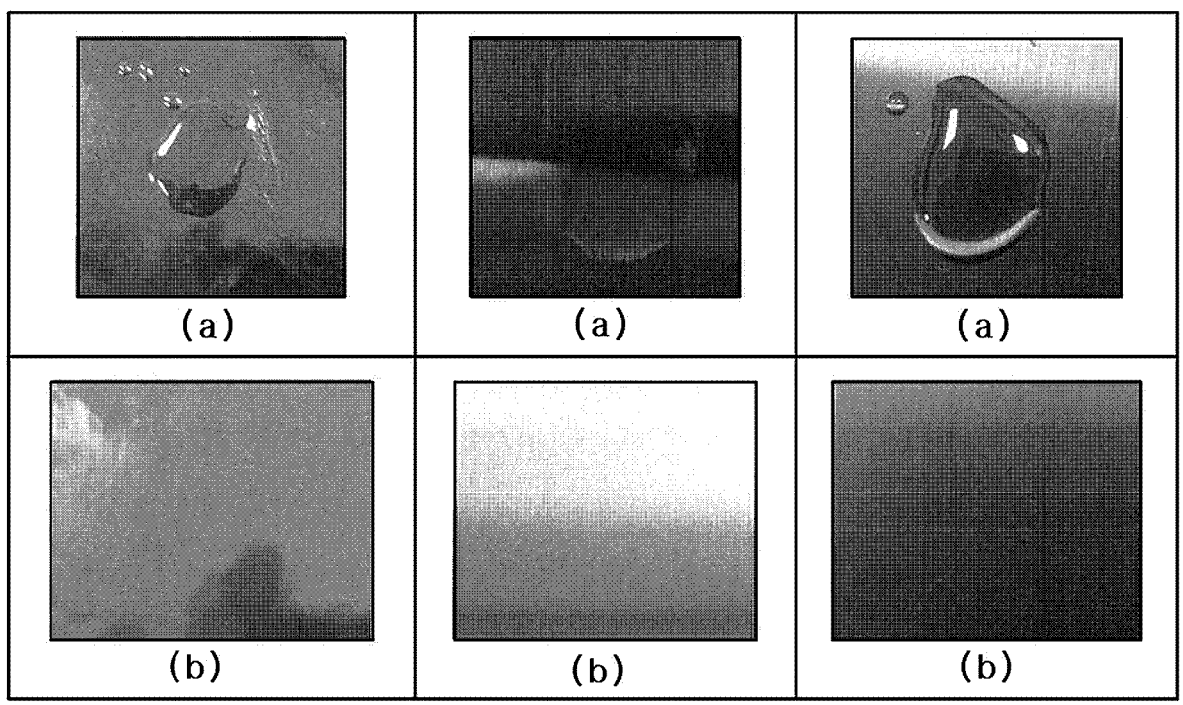
FIG. 13 is a photograph illustrating experiments on removal of contaminants with respect to cooking oil dropped on enamel, an exterior material of a home appliance not applied to a coating process of the disclosure, and an exterior material of a home appliance to which a coating process is applied according to the embodiment of the disclosure.

FIG. 11 is a photograph illustrating experiments on removal of contaminants from juice dropped on enamel, an exterior material of a home appliance not applied to a coating process of the disclosure, and an exterior material of a home appliance to which a coating process is applied according to the embodiment of the disclosure, FIG. 12 is a photograph illustrating experiments on removal of contaminants from soy sauce dropped on enamel, an exterior material of a home appliance not applied to a coating process of the disclosure, and an exterior material of a home appliance to which a coating process is applied according to the embodiment of the disclosure and FIG. 13 is a photograph illustrating experiments on removal of contaminants from cooking oil dropped on enamel, an exterior material of a home appliance not applied to a coating process of the disclosure, and an exterior material of a home appliance to which a coating process is applied according to the embodiment of the disclosure.

Ease of removal of contaminants in FIGS. 11 to 13, was confirmed by dropping juice, soy sauce and cooking oil into enamel, the exterior of the appliance not applied to the coating process, and the exterior of the appliance applied to the coating process and then leaving them for 48 hours and washing them with a wet towel.

In FIGS. 11 to 13, the left picture of each drawing is the case of the enamel, the center picture is the case of the exterior material of the home appliance not applied to the coating process, and the right picture is the case of the exterior material of the home appliance to which the coating process is applied according to an embodiment of the disclosure.

(a) of FIGS. 11 to 13 shows the state after 48 hours after dropping contaminants, and (b) of FIGS. 11 to 13 shows the state of washing with the wet towel.

The left (b) of FIG. 11 shows the case of washing the juice dropped into the enamel five times. It can be seen that the contaminants remain on the exterior of the home appliance.

The middle (b) of FIG. 11 shows the case of washing the juice dropped on the exterior of the appliance without the coating process five times. It can be seen that the contaminants remain on the exterior of the home appliance.

The right (b) of FIG. 11 shows the case of washing the juice dropped on the exterior of the appliance applied with the coating process five times. It can be seen that the contaminants on the exterior material of the home appliance are completely removed.

The left (b) of FIG. 12 shows the case of washing the soy sauce dropped into the enamel eight times. It can be seen that the contaminants remain on the exterior of the home appliance.

The middle (b) of FIG. 12 shows the case of washing the soy sauce dropped on the exterior of the appliance without the coating process eight times. It can be seen that the contaminants remain on the exterior of the home appliance.

The right (b) of FIG. 12 shows the case of washing the soy sauce dropped on the exterior of the appliance applied with the coating process eight times. It can be seen that the contaminants on the exterior material of the home appliance are completely removed.

The left (b) of FIG. 13 shows the case of washing the cooking oil dropped into the enamel one time. It can be seen that the contaminants on the exterior material of the home appliance are completely removed.

The middle (b) of FIG. 13 shows the case of washing the cooking oil dropped on the exterior of the appliance without the coating process one time. It can be seen that the contaminants on the exterior material of the home appliance are completely removed.

The right (b) of FIG. 13 shows the case of washing the cooking oil dropped on the exterior of the appliance applied with the coating process one time. It can be seen that the contaminants on the exterior material of the home appliance are completely removed.

As described above, in the case of the exterior material of the home appliance to which the coating process is applied according to the embodiment of the disclosure, it can be confirmed that the removal of the contaminants is easier than when the coating process is not applied to the exterior of the home appliance.

Figure 14:
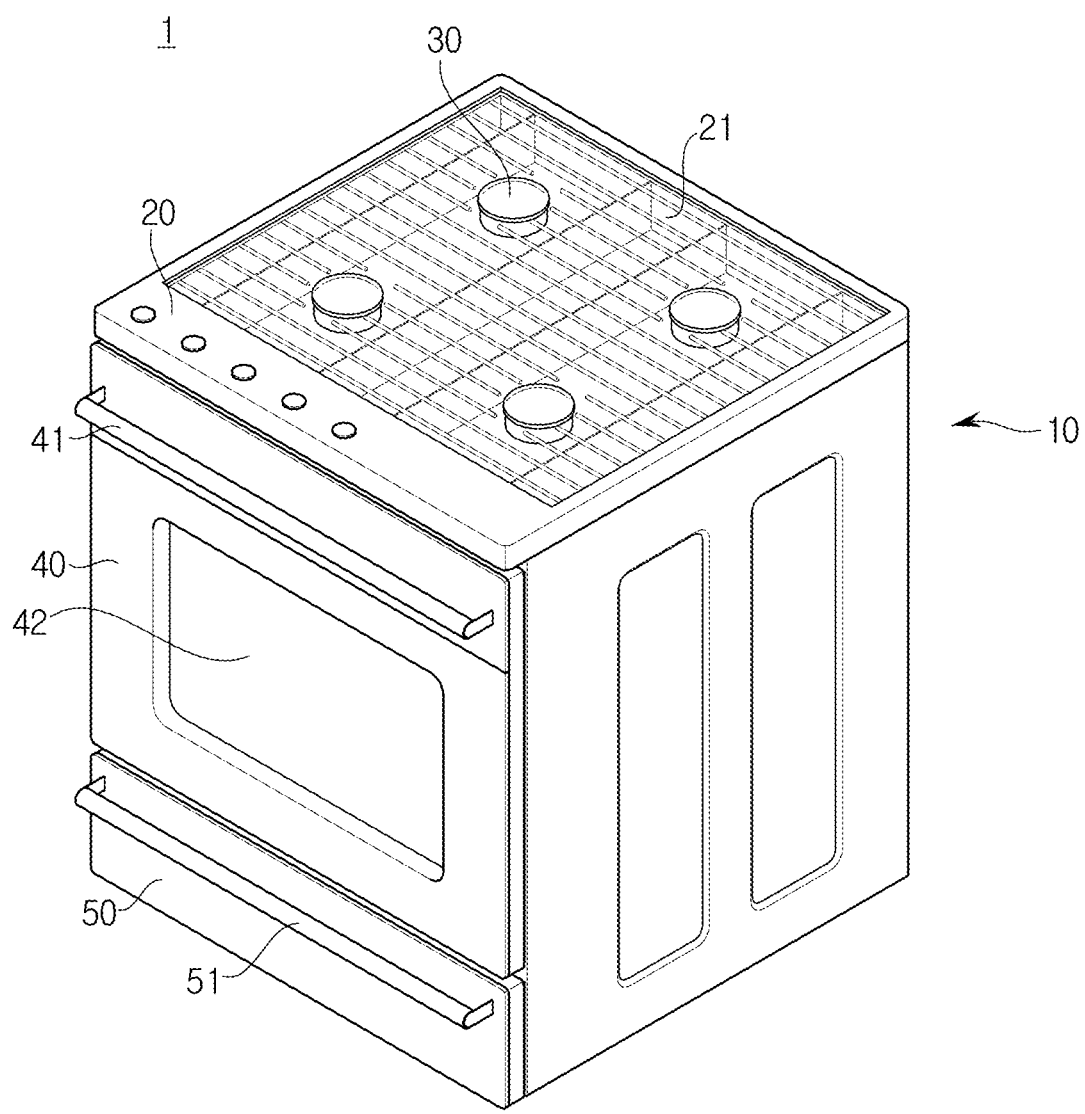
FIG. 14 is a diagram illustrating a home appliance according to one embodiment of the disclosure.

FIG. 14 is a diagram illustrating a home appliance according to one embodiment of the disclosure.

The home appliance according to an embodiment of the disclosure includes a main body 10 and a heating unit 30 is supplied with fuel for cooking food. The heating unit 30 may be located above the main body 10. A grille 21 may be provided between the heating units 30.

An oven may be provided on a front surface of the main body 10, and an oven door 40 may be provided to open and close the oven. The oven door 40 may include an oven grip portion 41 that can be gripped by a user. The oven door 40 may be provided with a window 42 so that the user can see the inside of the oven.

A lower part of the oven may be provided with a storage unit for storing tools necessary for cooking. The storage unit may be provided with a storage unit door 50 for opening and closing the storage unit, and the storage unit door 50 may be provided with a storage unit grip portion 51 that can be gripped by the user.

The heating unit 30 may be provided to penetrate through an exterior material 20 provided on an upper surface of the main body 10. The exterior material 20 is provided to include a substrate to which the above-described coating process and passivation treatment are applied.

As such, the exterior material of the home appliance according to the embodiment of the disclosure may be applied to a cooking appliance. However, the present invention is not limited thereto and may be applicable to the exterior material of a washing machine or a refrigerator in which stainless steel is used.

While the disclosure has been shown and described with reference to various embodiments thereof, it will be understood by those skilled in the art that various changes in form and details may be made therein without departing from the spirit and the scope of the disclosure as defined by the appended claims and their equivalents.

The invention claimed is:

1. An exterior material of a home appliance comprising:
   a substrate including a surface subjected to a passivation treatment;
   a diamond like carbon (DLC) coating layer formed on the passivated surface of the substrate;
   a buffer coating layer formed between the substrate and the DLC coating layer to improve adhesion between the substrate and the DLC coating layer; and
   an anti-fingerprint coating layer formed on an upper surface of the DLC coating layer.

2. The exterior material of the home appliance of claim 1, wherein the buffer coating layer includes a chrome buffer coating layer.

3. The exterior material of the home appliance of claim 1, wherein the passivation treatment of the substrate includes electrolytic pickling using a phosphate pickling solution, and an electrolytic passivation treatment using a solution containing a dichromate acid passivating solution and an amine additive.

4. The exterior material of the home appliance of claim 1, wherein an etching portion from which an oxide film is removed is formed on an upper surface of the substrate to increase adhesion to the DLC coating layer.

* * * * *